(12) United States Patent
Kim et al.

(10) Patent No.: US 8,623,125 B2
(45) Date of Patent: Jan. 7, 2014

(54) ELECTRODE FOR PLASMA GENERATION

(75) Inventors: Yoonho Kim, Shiga (JP); Kazuya Naito, Shiga (JP); Takashi Ogawa, Shiga (JP); Isao Tan, Shiga (JP); Hirohisa Tanaka, Shiga (JP); Hirotoshi Fujikawa, Shiga (JP); Kazuhiko Madokoro, Shiga (JP)

(73) Assignee: Daihatsu Motor Co., Ltd., Osaka (JP)

( * ) Notice: Subject to any disclaimer, the term of this patent is extended or adjusted under 35 U.S.C. 154(b) by 687 days.

(21) Appl. No.: 12/671,732

(22) PCT Filed: Jul. 28, 2008

(86) PCT No.: PCT/JP2008/063495
§ 371 (c)(1),
(2), (4) Date: Feb. 2, 2010

(87) PCT Pub. No.: WO2009/019998
PCT Pub. Date: Feb. 12, 2009

(65) Prior Publication Data
US 2011/0232492 A1  Sep. 29, 2011

(30) Foreign Application Priority Data
Aug. 3, 2007  (JP) .................................. 2007-202543

(51) Int. Cl.
*B03C 3/45*  (2006.01)

(52) U.S. Cl.
USPC ........................................ 96/67; 96/98; 96/99

(58) Field of Classification Search
USPC ................ 96/67, 98, 99, 95, 96; 55/497, 521, 55/DIG. 5; 95/78; 313/293, 348
See application file for complete search history.

(56) References Cited

U.S. PATENT DOCUMENTS

| | | | | | |
|---|---|---|---|---|---|
| 3,997,304 | A | * | 12/1976 | Carr | 96/67 |
| 5,630,866 | A | * | 5/1997 | Gregg | 96/67 |
| 6,660,061 | B2 | * | 12/2003 | Josephson et al. | 95/2 |
| 6,749,669 | B1 | * | 6/2004 | Griffiths et al. | 96/67 |
| 7,156,898 | B2 | * | 1/2007 | Jaisinghani | 95/63 |
| 2010/0107882 | A1 | * | 5/2010 | Dooley | 96/54 |

FOREIGN PATENT DOCUMENTS

| | | | |
|---|---|---|---|
| JP | 56-126612 | 10/1981 | |
| JP | 61-209061 A * | 9/1986 | 96/67 |
| JP | 2001-009232 | 1/2001 | |
| JP | 2001-9232 A | 1/2001 | |
| JP | 2002-095996 | 4/2002 | |
| JP | 2002-95996 A | 4/2002 | |

(Continued)

OTHER PUBLICATIONS

International Search Report for PCT/JP2008/063495 (WO/2009/019998), Issued Oct. 21, 2008.

(Continued)

*Primary Examiner* — Richard L Chiesa
(74) *Attorney, Agent, or Firm* — Banner & Witcoff, Ltd.

(57) ABSTRACT

An electrode for plasma generation according to the present invention includes a plurality of collecting portions having a plurality of through holes, the plurality of collecting portions facing a gas flow in a direction where gas to be treated flows and provided spaced apart from each other. The electrode is applied to a plasma reactor of a treatment device to be provided for a device which discharges the smoke including PM, for example, an exhaust gas purifying device for automobile, or a smoke treatment device used in a facility where the smoke is discharged such as a plant.

3 Claims, 5 Drawing Sheets

(56) References Cited

FOREIGN PATENT DOCUMENTS

| | | |
|---|---|---|
| JP | 2003-013725 | 1/2003 |
| JP | 2003-13725 A | 1/2003 |
| JP | 2003-529705 | 10/2003 |
| JP | 2004-223344 | 8/2004 |
| JP | 2004-223344 A | 8/2004 |
| JP | 2005-030280 | 2/2005 |
| JP | 2005-30280 A | 2/2005 |
| JP | 2009-112916 | 5/2009 |
| JP | 2009-208025 | 9/2009 |
| JP | 2010-115566 | 5/2010 |
| WO | 2005-028081 | 3/2005 |

OTHER PUBLICATIONS

Office Action issued in corresponding Japanese Patent Application No. 2007-202543 mailed Oct. 16, 2012.

Japanese Patent Application 2009-526393, Notice of Allowance, mailed Jul. 2, 2013.

* cited by examiner

ELECTRODE FOR PLASMA GENERATION

CROSS REFERENCE TO RELATED APPLICATIONS

This application is a National Stage application of co-pending PCT application PCT/JP2008/063495 filed Jul. 28, 2008, which claims the benefit of Japanese application number P2007-202543 filed Aug. 3, 2007. These applications are incorporated herein by reference in their entireties.

TECHNICAL FIELD

The present invention relates to an electrode for plasma generation, more particularly to an electrode for plasma generation suitably used in, for example, a device for removing any environmentally detrimental substances included in the smoke discharged from a factory, a plant and an internal combustion engine.

BACKGROUND ART

A catalyst and a DPF (diesel particulate filter) are conventionally used to reduce an emission of CO (carbon monoxide), HC (hydrocarbon), $NO_x$ (nitrogen oxides) and PM (particulate matters) included in exhaust gas discharged from an automotive engine, more particularly a diesel engine. In the DPF, however, circulation of the exhaust gas is impaired as PM is collected and increased inside, and an exhaust resistance of the diesel engine is increased, thereby resulting in declines of fuel efficiency and outputs.

In recent years, there have been attempts to improve the above technical disadvantage, for example, removal of the collected PM through oxidation into gas ($CO_2$) and reduction of the emission of such substances as PM by reforming the exhaust gas. A known approach for solving the problem is to use a plasma reactor in an exhaust gas purifying device including a catalyst. For example, in the exhaust gas purifying device for internal combustion engine described in Patent Document 1 includes at least a pair of discharge electrodes, wherein exhaust gas is flown between the discharge electrodes so that the exhaust gas is purified by discharge. In this device, a corrugated auxiliary electrode is disposed between the discharge electrodes so that protruding and recessed portions thereof extend along a direction of the exhaust gas flow in order to ensure a flow channel of the exhaust gas and improve discharge efficiency.

Patent Document 1: Japanese Unexamined Patent Publication No. 2001-9232

DISCLOSURE OF THE INVENTION

Problems to be Solved by the Invention

An exhaust gas purifying device equipped with such a plasma reactor is conventionally adapted to remove PM by collecting PM between the discharge electrodes and combusting the collected PM using plasma. In such a device, a discharge generated between the discharge electrodes can be equalized by the auxiliary electrode, however, a filtering performance of the discharge electrodes for PM is inadequate because PM transmits through the discharge electrodes. That is, although discharge performance is improved by providing the auxiliary electrode, since a flow channel of the exhaust gas is broadened at the same time, the device still has a difficulty in collecting PM. Therefore, when PM is combusted by using plasma generated by the discharge, most of the PM quite possibly transmits through between the discharge electrodes before combustion. Thus, the auxiliary electrode poorly contributed to the removal of PM.

An object of the present invention is, therefore, to solve the problems described above.

Means for Solving the Problems

An electrode for plasma generation according to the present invention includes a plurality of collecting portions having a plurality of through holes, the plurality of collecting portions facing a gas flow in a direction where gas to be treated flows and provided spaced apart from each other.

With such a configuration, when the electrode is used in a plasma reactor and the gas to be treated passes through the through holes, PM included in the gas is physically and electrostatically attached to the through holes. The PM attached to the through holes is sequentially combusted by plasma. As a result, the gas having transmitted through the plasma reactor no longer includes most of the PM. Since PM is combusted by plasma, PM is not left in the through holes to narrow a gas channel of the plasma reactor. Thus, PM can be efficiently removed from the gas.

To increase the efficiency of collecting the PM included in the gas, the plurality of collecting portions are preferably continuously formed such that a sheet of meshy member is bent in the gas flow direction and a direction substantially orthogonal to the direction in a corrugated shape.

Examples of the meshy member include a net and a plate member provided with a plurality of through holes having openings as in a net. More specifically, examples of the meshy member are a net produced by weaving thin linear metal members and a plate member obtained by forming a plurality of through holes in a metal flat plate in a manner similar to a net. In this case, the through holes may be formed in any shape such as circular, elliptical, polygonal or irregular shape. The shape may be selected based on dimensions and shapes of particles to be collected.

To increase PM removal efficiency by changing intensity of discharge and a collecting degree of PM along the gas flow direction, the collecting portions in an upstream of the gas flow direction are preferably formed less densely than the collecting portions in a downstream thereof.

Effects of the Invention

With the configuration described above, PM collection efficiency can be improved in the present invention. When the present invention is used in a plasma reactor, gas to be treated can be efficiently purified.

The present invention can be applied to a plasma reactor of a treatment device to be provided in, for example, a facility.

DESCRIPTION OF REFERENCE SYMBOLS 1 electrode for plasma generation
3 collecting portion
4 through hole
100 plasma reactor

BEST MODE FOR CARRYING OUT THE INVENTION

Hereinafter, embodiments of the present invention are described with reference to the drawings.

Figure 1:
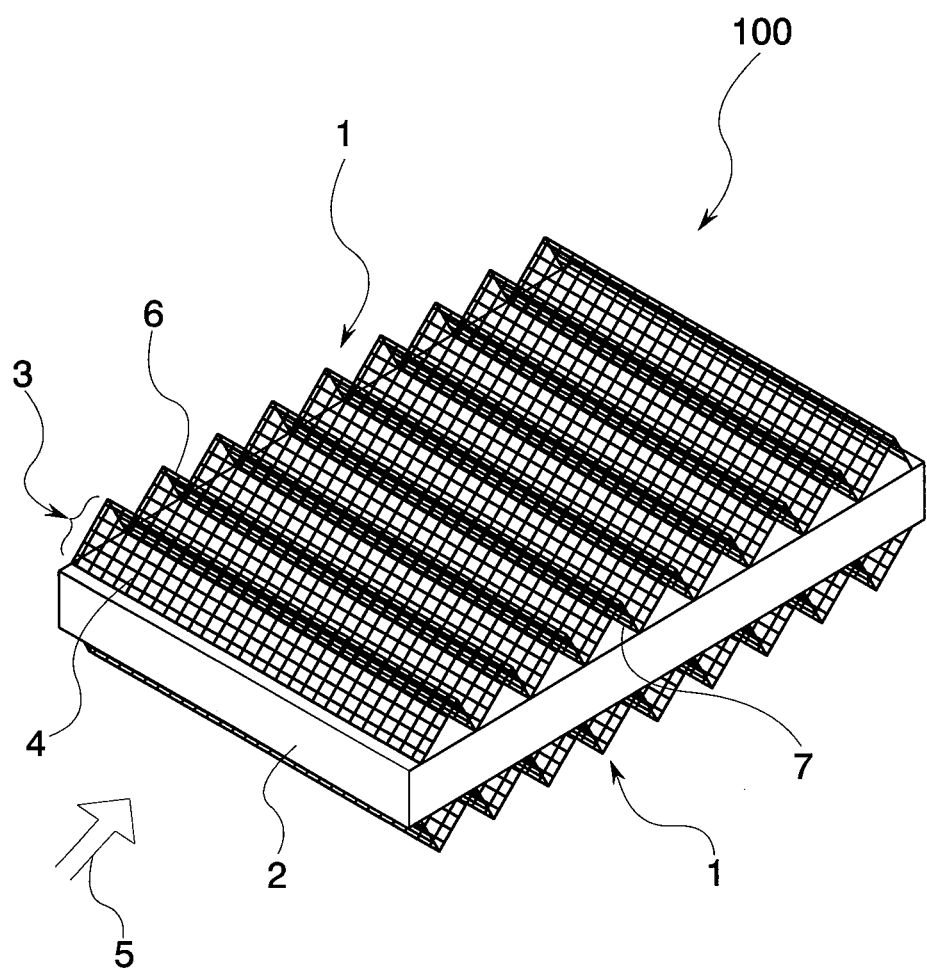
FIG. 1 is a perspective view illustrating a usage state of a first embodiment of the present invention.
Figure 2:
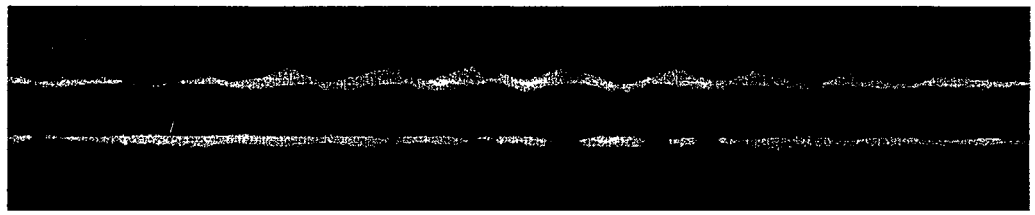
FIG. 2 is a photograph showing a state of plasma emission according to the first embodiment.

An electrode for plasma generation (hereinafter, simply referred to as electrode) 1 according to a first embodiment of the present invention is mounted in a plasma reactor 100 to serve as a discharge electrode. The plasma reactor 100 is for treating exhaust gas and the like including PM discharged from a diesel engine. The electrode 1, when used, is combined with a dielectric member 2 formed in the shape of a flat plate as illustrated in FIG. 1.

The electrode 1 is formed such that a metal net, which is a meshy member obtained by weaving, for example, line members made of stainless steel, is bent substantially in a shape having triangular corrugations so that collecting portions 3 are continually formed at certain intervals. More specifically, the metal net constituting the electrode 1 has a large number of through holes (meshes) 4 formed by transversely and longitudinally weaving line members having a predetermined thickness. That is, the line members are woven to form the meshes such that a plurality of longitudinal line members are aligned with spaces therebetween and a plurality of transverse line members are passed therethrough so as to cross the longitudinal line members like a cloth, or a plurality of longitudinal line members aligned with spaces therebetween and a plurality of transverse line members likewise aligned with spaces therebetween are welded or secured to each other at contact points thereof by, for example, an adhesive so that meshes are formed. The shape of the mesh may be a square, a rectangle or a rhombus, or may be a polygon by additionally providing line members other than the longitudinal and transverse line members. Such a metal net is bent so as to repeat mountain folds and valley folds at substantially equal intervals in one direction, for example, a longitudinal direction of the metal net, i.e., electrode 1, and thereby formed substantially in the shape having triangular corrugations.

When the metal net is bent at substantially equal intervals so as to have substantially triangular corrugations, a part of the metal net is consecutively elevated with a tilt at a predetermined height in the longitudinal direction of the metal net. The tiltingly elevated portions constitute the collecting portions 3. In these collecting portions 3 constituting a part of the metal net, there are a large number of through holes 4 formed by the line members in the longitudinal direction and the line members in a width direction. The through holes 4 correspond to dimensions of PM, and are formed in such dimensions that can collect the PM existing in exhaust gas.

The electrode 1 formed in such a shape is disposed on two oppositely-oriented surfaces of the dielectric member 2 having the flat-plate shape to be used in the plasma reactor 100. In this case, the electrodes 1 are respectively disposed so that a direction where the corrugations are continuous, that is, the longitudinal direction of the metal net, is in line with an exhaust gas flow direction 5 in the plasma reactor 100 (shown with an arrow in FIG. 1). In other words, a direction where the collecting portions 3 of the electrode 1 are continuous is arranged in line with the exhaust gas flow direction 5. Accordingly, the meshes and the through holes 4 of the metal net constituting the electrode 1 are arranged in an orderly manner in the exhaust gas flow direction 5, allowing no flow channel for the exhaust gas other than the through holes 4.

When a voltage is applied to between the electrodes 1 in the plasma reactor 100, plasma is generated between the electrodes 1 and in the through holes 4 of the electrodes 1. The application of voltage makes charges converge in upper and lower ends of the collecting portions 3 of the electrodes 1, that is, in fold line portions of mountain folds 6 and valley folds 7 constituting the triangular corrugations. Then, electrons are released from the charge-converged portions into the exhaust gas to efficiently generate plasma. In other words, electrons and the like are released into the exhaust gas, making the exhaust gas itself serve as plasma including various activated species. These activated species and PM, i.e., carbon, are reacted with each other to generate $CO_2$, and the exhaust gas can be purified with the PM removed therefrom. Accordingly, the plasma discharge can be more efficiently performed about the fold line portions. As a result, plasma is generated in an entire area of the electrodes 1. Therefore, a high plasma emission luminance is exerted, and broad discharge space is obtained. In general, the plasma emission luminance is substantially proportional to an applied maximum voltage (MAX voltage), and the luminance becomes higher as the voltage increases. In the present embodiment, specifically, it is confirmed that plasma is generated substantially equally in the entire area of the electrodes 1 when, for example, the voltage of 8 kV with the frequency of 200 Hz is applied.

In this manner, plasma can be generated intensively, and by applying the plasma reactor 100 in a exhaust gas purifying device for purifying exhaust gas of a diesel engine (or exhaust gas post-treatment device), PM included in the exhaust gas is collected in the through holes 4 of the electrodes 1. PM having diameters smaller than the through holes 4 are electrostatically attached to the through holes 4. Thus, the PM having diameters smaller than the through holes 4 are electrostatically collected in the electrodes 1 by electrostatic adsorption. The PM thus collected and attached to the through holes 4 is combusted by the plasma and removed from the exhaust gas discharged from the exhaust gas purifying device. As a result, the device can be more competent in purifying the exhaust gas. The PM physically and electrostatically collected in the through holes 4 is sequentially combusted so that the electrodes 1 are not clogged. Therefore, a filtering function of the electrodes 1 is not deteriorated by uninterrupted supply of the exhaust gas to the plasma reactor, which prevents the decrease of an opening ratio of the through holes 4 constituting the flow channel of the exhaust gas. As a result, a pressure loss in the exhaust gas purifying device is reduced, thereby preventing reduction in the fuel efficiency and outputs of the diesel engine.

Further, in the first embodiment, the woven metal wires made of stainless steel are used as the metal net constituting the electrode 1, so that a durability higher than a porous electrode made of nickel invented earlier by the present inventors can be achieved. Moreover, since such an easily accessible material is used, the electrode can be inexpensively and easily produced.

Figure 3:
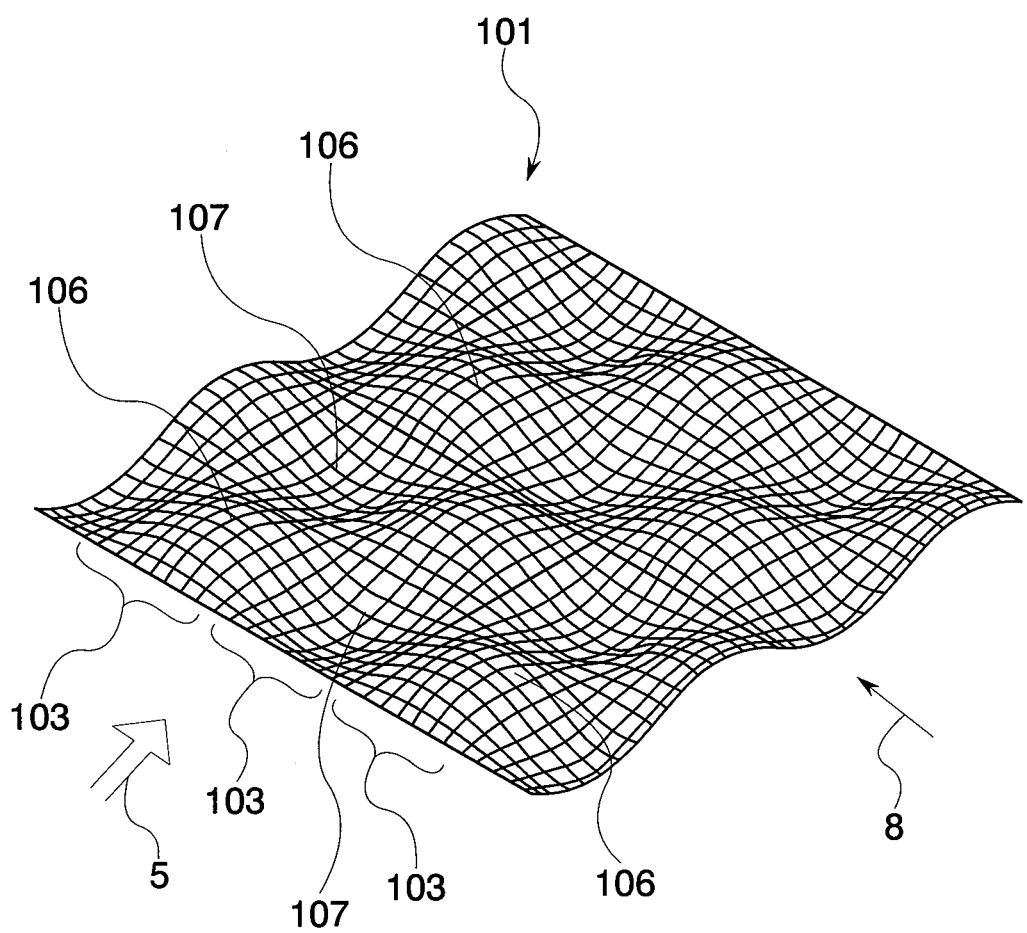
FIG. 3 is a perspective view illustrating a second embodiment of the present invention.

In the first embodiment, the metal net bent in the shape having triangular corrugations was used as the electrode 1. As illustrated in FIG. 3, an electrode 101 may be formed such that a metal net made of stainless steel, for example, is bent in a longitudinal direction thereof at substantially equal intervals so that a cross section thereof has, for example, substantially semi-circular corrugations, and also bent in a width direction of the metal net at substantially equal intervals so that a cross section thereof has a similar corrugated shape. In other words, this electrode according to a second embodiment is bent in a corrugated shape in the exhaust gas flow direction 5 and a direction 8 substantially orthogonal thereto so that a plurality of collecting portions 103 are continuously formed in the plasma reactor. It should be noted that FIG. 3 does not illustrate an overall shape of the electrode 101. However, the overall structure of the electrode 101 can be fully understood from the illustration of a part thereof because the collecting portions 103 are continuously provided in an orderly manner in the electrode 101.

When the electrode 101 obtained by bending the metal net in the corrugated shape in the longitudinal and width directions thereof is viewed from the exhaust gas flow direction 5, protruding portions 106 and recessed portions 107 are alternately present in the width direction, and the protruding portions 106 and the recessed portions 107 are also alternately present in a depth direction. Accordingly, there are spaces between the adjacent protruding portions 106 and between the adjacent recessed portions 107 in the electrode 101, and these spaces facilitate circulation of the exhaust gas. When the exhaust gas is supplied, if a large volume of PM is collected in the through holes 104 on an upstream side of the exhaust gas and not immediately combusted, that is, if the through holes 104 are clogged, PM is still collected in the collecting portions 103 having the protruding portions 106 and the recessed portions 107 on a downstream side thereof.

In the electrode 101 according to the present embodiment, PM from the exhaust gas is extensively collected in the entire area of the electrode 101. Specifically, since spaces larger than the through holes 104 exist between the protruding portions 106 and between the recessed portions 107, the exhaust gas collides against the collecting portions 103 in the upstream and flows into the spaces. The exhaust gas is then headed downstream while avoiding the collecting portions 103. The exhaust gas further collides against the collecting portions 103 in the downstream so that PM is also collected in the downstream collecting portions 103 in a manner similar as in the upstream. Accordingly, PM can be more efficiently collected, and a PM removal rate can be consequently improved.

According to the two embodiments described above, the electrodes 1, 101 are both provided with the collecting portions 3, 103 substantially equally spaced. However, the collecting portions 3, 103 may be differently spaced in the exhaust gas flow direction 5 respectively on the upstream side and the downstream side of the electrodes 1, 101. When the metal net is processed into the electrode, spaces between the collecting portions 3, 103 are set large on the upstream side closer to where the exhaust gas is introduced into the plasma reactor, while spaces between the collecting portions 3, 103 are set smaller on the downstream side closer to where the exhaust gas is discharged. In other words, in the electrodes 1, 101, the collecting portions 3, 103 distantly formed are provided on the upstream side in the exhaust gas flow direction, while the collecting portions 3, 103 densely formed than the upstream side are provided on the downstream side.

Figure 4:
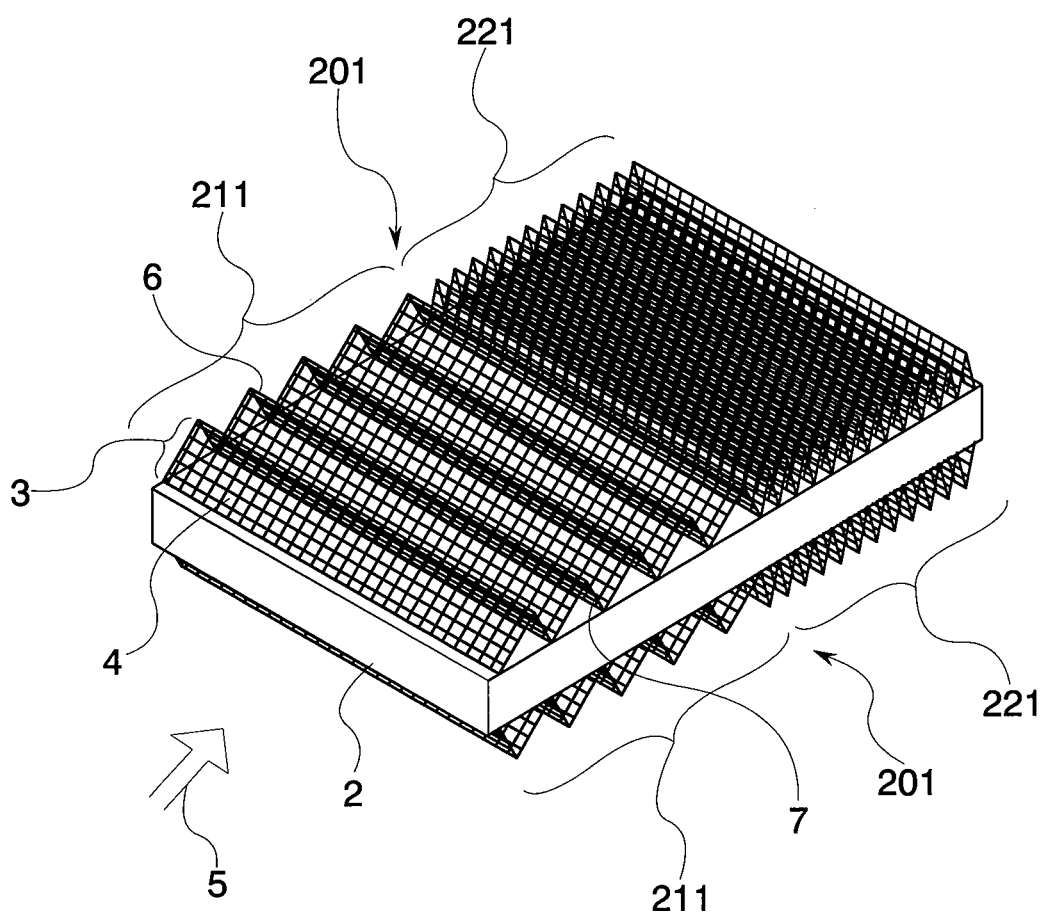
FIG. 4 is a perspective view illustrating a modified example of an electrode for plasma generation according to the first embodiment of the present invention.

In this case, the collecting portions 3, 103 may be differently spaced in an approximately ½ area of the electrodes 1, 101 in the exhaust gas flow direction 5, or the spaces may be continuously changed from the upstream toward the downstream (from the downstream toward the upstream). In either case, the electrodes 1, 101 are produced so that the collecting portions 3, 103 are formed in the upstream in the exhaust gas flow direction 5 less densely than the collecting portions 3, 103 in the downstream in the exhaust gas flow direction 5. In other words, the number of the upstream collecting portions 3, 103 per unit distance or unit area is smaller than the number of the downstream collecting portions 3, 103 per unit distance or unit area. FIG. 4 is an illustration of an electrode 201 according to a modified example of the first embodiment, where the upstream collecting portions 3 are formed less densely than the downstream collecting portions 3. In the figure, intervals between the folds are larger in an upstream region 211 of the electrode 201 than in a downstream region 221 thereof, and the collecting portions 3 of the upstream region 211 are thereby formed less densely than those in the downstream region 221.

When the collecting portions 3, 103 of the electrodes 1, 101 are thus spaced differently respectively in the upstream and downstream regions in the exhaust gas flow direction, a collection rate of PM included in the exhaust gas can be changed so as to prevent PM from clogging the electrodes. According to the configuration wherein the collecting portions 3, 103 in the downstream region in the exhaust gas flow direction are formed more densely than those in the upstream region, a discharge performance and a physical and electrostatic PM adsorption rate in the downstream region can be increased, so that the PM removal efficiency, i.e., exhaust gas purification efficiency can be improved. The more densely the collecting portions 3, 103 are formed, the more frequently the exhaust gas comes into contact with the collecting portions 3, 103. Accordingly, more PM can be physically and electrostatically collected in the downstream region than in the upstream region. The collected PM is reacted with activated species generated in the upstream region and thereby removed. As a result, the PM removal efficiency is improved.

Although the metal net was used as the electrode material in the embodiments described above, a thin plate having a plurality of through holes, for example, a flat plate made of stainless steel may also be used. In other words, any meshy metal member can be used as the electrode material as long as it is provided with a plurality of through holes without having to weave thin line members like the metal net. The through hole may be formed in any of circular, triangular, polygonal and arbitrary shapes. It is preferable that metal portions between the through holes be formed in minimal dimensions so that a total area of the through holes as compared with an area of the flat plate can be maximized.

The through holes may be formed in dimensions corresponding to particle diameters of PM and the like included in gas to be treated, and sizes of through holes may be changed respectively in the upstream and downstream regions. More specifically, the through holes in the upstream region of the electrode are set to have large diameters, and the through holes in the downstream region thereof are set to have small diameters.

The meshy member may be bent substantially in the shape having triangular corrugations or the shape of sine wave, or the shape of a plurality of continuous radial corrugations or a plurality of continuous polygonal corrugations. Any of these shapes may be selected in view of processability. In this case, a height and an interval of the fold may be set depending on a performance of a plasma reactor to be used.

The collecting portions are not necessarily planarly formed as described in the first embodiment. A corrugated plane or a plane with a plurality of protruding portions and recessed portions formed regularly or irregularly may constitute the collecting portions. That is, the collecting portions are not two-dimensionally but three-dimensionally formed. With such a configuration, an apparent surface area of the collecting portions is increased so that the number of the through holes in the collecting portions is increased.

Although the dielectric member described in the above embodiments has the shape of a flat plate, a porous member having a large number of cavities and holes on a surface thereof and therein may also be used.

The specific configurations of the components are not necessarily limited to those described in the above embodiments, and can be variously modified within the sprit and scope of the present invention.

Figure 5:
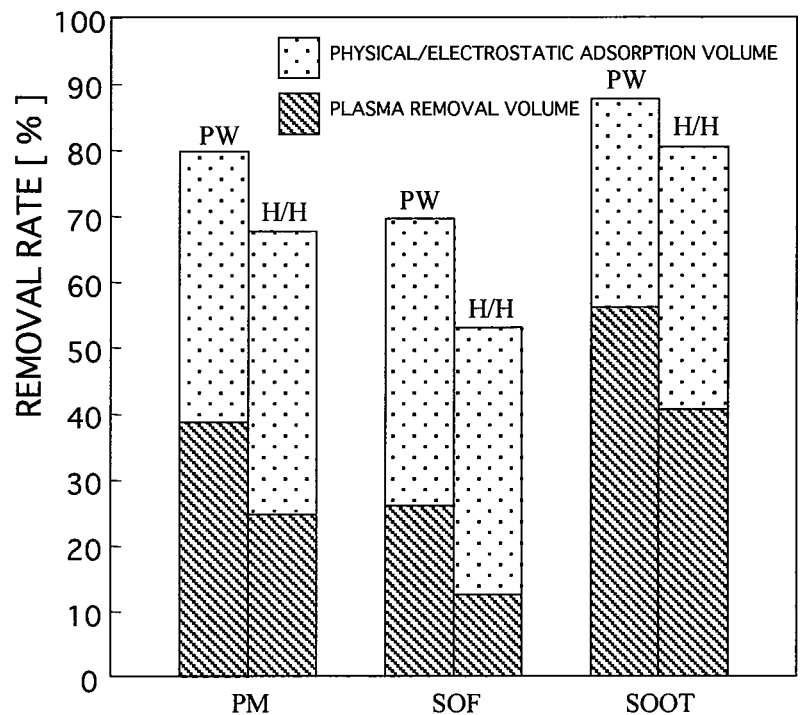
FIG. 5 is a graph showing a test result of a removal rate of PM and the like in a plasma reactor in which the electrode according to the first embodiment of the present invention is used.
Figure 6:
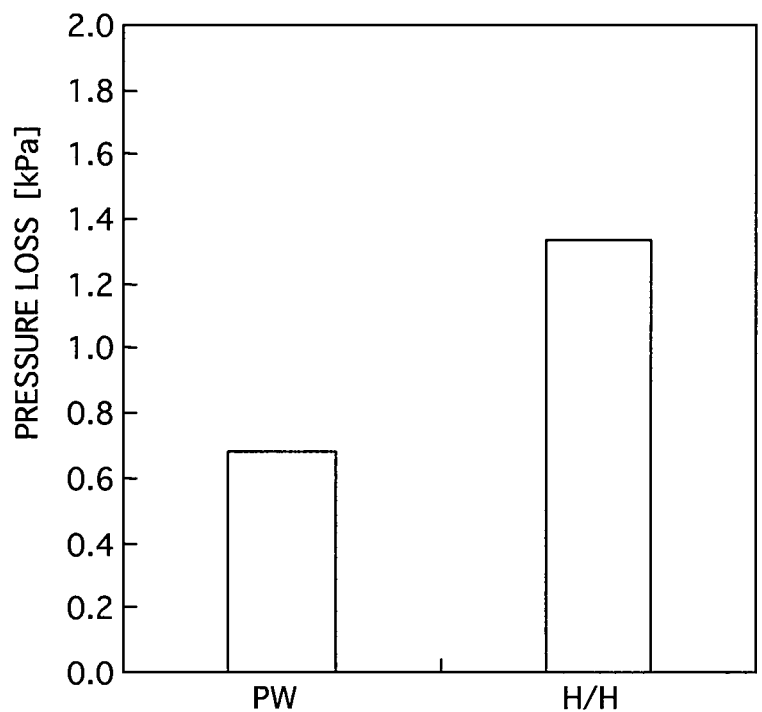
FIG. 6 is a graph showing a test result of a pressure loss in the plasma reactor in which the electrode according to the first embodiment of the present invention is used.

Lastly, a test result of a plasma reactor PW in combination with a 2-cycle diesel engine is described below with reference to FIGS. 5 and 6. The plasma reactor PW includes 24 electrode assemblies each equipped with the combination of two electrodes 1 and one dielectric member 2, such as an aluminum flat plat, disposed between the electrodes 1 described in the first embodiment. The 2-cycle diesel engine was driven in 10/15 mode (test measurement mode of automotive exhaust gas set by Ministry of Land, Infrastructure, Transport and Tourism of Japan) using a simulation dynamometer, and also was driven 40 km per hour. In FIGS. 5 and 6, PW denotes the plasma reactor according to the first embodiment, and H/H denotes a plasma reactor as a comparative example described below.

The comparative example used the plasma reactor H/H including 24 electrode assemblies each equipped with the combination of two porous electrodes which are porous flat plates made of, for example, nickel and a dielectric member having the shape of a flat plate and made of the same material as that of the dielectric member in the electrode assemblies described above. Although no particular reference is made to the shapes of holes in the porous electrodes of the plasma reactor H/H used as the comparative example, the holes are formed such that they are less densely spaced on an upstream side where exhaust gas of the diesel engine is introduced and more densely spaced on a downstream side than in the upstream.

The respective plasma reactors were tested so as to measure removal rates of PM included in the discharged exhaust gas, fractions of PM, specifically SOF (Soluble Organic Fraction), and soot when the diesel engine was driven in 10/15 mode. Further, measurements were carried out to determine volumes of the constituents removed from the exhaust gas through physical and electrostatic adsorption of the constituents to the electrodes of the plasma reactors PW and H/H (hereinafter, referred to as physical/electrostatic adsorption volumes) and volumes of the constituents removed from the exhaust gas by generated plasma (hereinafter, referred to as plasma-removal volumes) so that removal rates of the physical/electrostatic adsorption volumes and plasma-removal volumes were found.

As a result, the plasma reactor PW in which the electrodes according to the first embodiment were used showed higher removal rates in the plasma-removal volumes than the plasma reactor H/H as the comparative example. On the whole, the removal rates of the plasma reactor PW were higher than those of the plasma reactor H/H as the comparative example. Therefore, the removal rates of SOF and soot included in PM were also higher in the plasma reactor PW than the plasma reactor H/H as the comparative example. In particular, the removal of soot using plasma was more remarkable in the plasma reactor PW using the electrodes of the present invention that efficiently generates plasma, than in the plasma reactor H/H used as the comparative example.

Thus, since the PM removal rate using plasma is high, the volume of PM left in the electrodes is small, thereby decreasing the pressure loss in the plasma reactor PW. The diesel engine was retained in such a traveling condition that a vehicle was constantly driven at 40 km per hour, and the pressure loss was measured by a difference between an inlet-side pressure and an outlet-side pressure of the plasma reactor at the time. A result thereby obtained showed that the pressure loss in the plasma reactor PW using the electrodes according to the first embodiment was substantially ½ of the pressure loss in the comparative example which is inferior in removal rates of the plasma-removal volumes. It is learnt from these results that the plasma reactor PW is advantageous in that the collecting portions are configured so as to facilitate the circulation of the exhaust gas as compared with the comparative example, and the discharge space larger than that of the comparative example can increase the efficiency in the removal of PM that are physically and electrostatically collected. It is expected, therefore, that the electrode is less likely to be clogged, and good PM removal performance can be maintained for a long period of time.

INDUSTRIAL APPLICABILITY

The present invention can be applied to a plasma reactor of a treatment device to be provided for a device which discharges flue gas including PM, for example, an exhaust gas purifying device for automobile, or a flue gas treatment device used in a facility where the smoke is discharged such as a plant.

The invention claimed is:

1. An electrode for plasma generation comprising a plurality of collecting portions having a plurality of through holes, the plurality of collecting portions facing a gas flow in a direction where gas to be treated flows and provided spaced apart from each other; wherein
   the plurality of collecting portions are continuously formed so that a sheet of meshy member is bent in a corrugated shape along the longitudinal direction of the meshy member; and
   the plurality of collecting portions are arranged in the gas flow direction.

2. The electrode for plasma generation according to claim 1, wherein intervals between the folds of the meshy member are larger in an upstream of the gas flow direction than in a downstream thereof, and consequently the collection portions in an upstream of the gas flow direction are formed less densely than the collecting portions in a downstream thereof.

3. The electrode of claim 1 wherein the meshy member is bent so as to repeat mountain folds and valley folds and thereby formed substantially in the shape having triangular corrugations.

* * * * *

UNITED STATES PATENT AND TRADEMARK OFFICE
CERTIFICATE OF CORRECTION

PATENT NO.       : 8,623,125 B2
APPLICATION NO.  : 12/671732
DATED            : January 7, 2014
INVENTOR(S)      : Kim et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 688 days.

Signed and Sealed this
Twenty-second Day of September, 2015

Michelle K. Lee
*Director of the United States Patent and Trademark Office*